United States Patent
Tain et al.

(10) Patent No.: US 7,948,072 B2
(45) Date of Patent: May 24, 2011

(54) WAFER-TO-WAFER STACKING

(75) Inventors: Ra-Min Tain, Taipei County (TW);
Shu-Ming Chang, Taipei County (TW);
Shyi-Ching Liau, Hsinchu County
(TW); Wei-Chung Lo, Taipei County
(TW); Rong-Shen Lee, Hsinchu County
(TW); Chi-Shih Chang, Austin, TX
(US)

(73) Assignee: Industrial Technology Research Institute, Hsinchu (TW)

( * ) Notice: Subject to any disclaimer, the term of this patent is extended or adjusted under 35 U.S.C. 154(b) by 220 days.

(21) Appl. No.: 12/180,360

(22) Filed: Jul. 25, 2008

(65) Prior Publication Data
US 2010/0020502 A1    Jan. 28, 2010

(51) Int. Cl.
*H01L 23/48* (2006.01)
(52) U.S. Cl. .. 257/686; 257/777; 257/778; 257/E23.169
(58) Field of Classification Search .................. 257/686, 257/777, 778, E23.169
See application file for complete search history.

(56) References Cited

U.S. PATENT DOCUMENTS

| | | | | |
|---|---|---|---|---|
| 4,954,875 A | * | 9/1990 | Clements | 257/686 |
| 7,262,495 B2 | | 8/2007 | Chen et al. | |
| 7,514,775 B2 | * | 4/2009 | Chao et al. | 257/686 |
| 2002/0163079 A1 | * | 11/2002 | Awano | 257/750 |
| 2005/0224921 A1 | * | 10/2005 | Gupta et al. | 257/621 |
| 2007/0090490 A1 | | 4/2007 | Chang et al. | |
| 2008/0083975 A1 | * | 4/2008 | Chao et al. | 257/686 |

FOREIGN PATENT DOCUMENTS

| | | |
|---|---|---|
| CN | 101162698 A | 4/2008 |
| CN | 101162717 A | 4/2008 |
| TW | 094137522 | 8/2007 |

* cited by examiner

*Primary Examiner* — Tuan N. Quach

(57) ABSTRACT

A wafer-to-wafer stacking having a hermetic structure formed therein is provided. The wafer stacking includes a first wafer, including a first substrate and a first device layer having thereon at least one chip and at least one low-k material layer, a second wafer disposed above the first wafer and having a second substrate, and a closed structure disposed on the at least one chip and arranged inside a cutting edge of the at least one chip, wherein the closed structure is extended from one side of the first device layer far from the first substrate to the other side thereof adjacent to the first substrate.

19 Claims, 5 Drawing Sheets

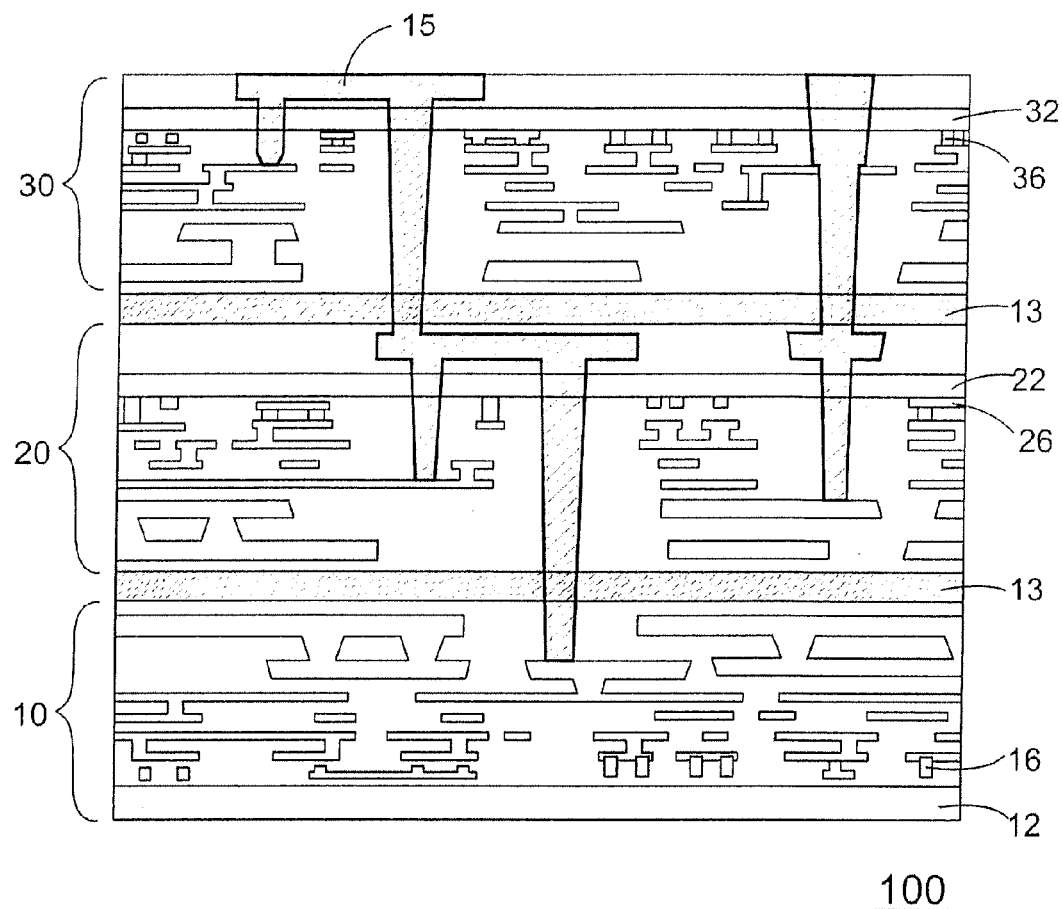
Fig. 1 (A) (Prior Art)
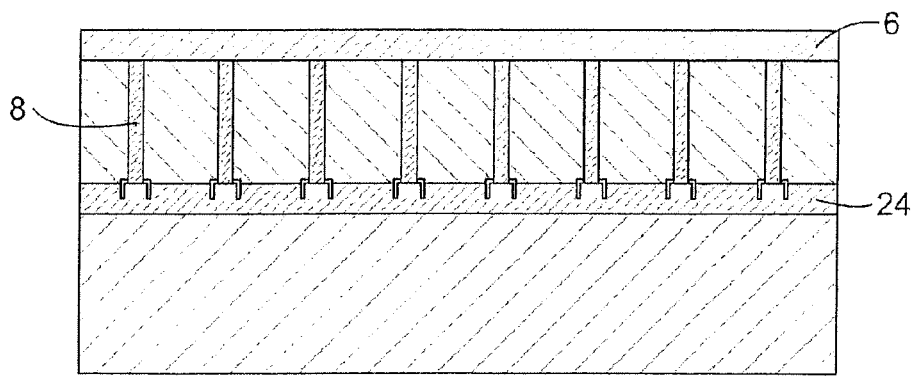
Fig. 1 (B) (Prior Art)

WAFER-TO-WAFER STACKING

FIELD OF THE INVENTION

The present invention relates to a wafer stacking structure, and in particular to a hermetic three dimensional wafer stacking having a closed supporting pedestal.

BACKGROUND OF THE INVENTION

As the rapid development of the semiconductor process, more and more electronic products can be provided with higher performance, higher portability and more compactness. Under such a development trend, the size of the chip used for the electronic products could be remarkably miniaturized, but the integrated circuits contained in the chip would become more and more complicated. Although the photolithography technique applied on the semiconductor wafer are moving into tens nanometer scale to meet the requirements for the miniaturization of semiconductor chip, it is clear that the tens nanometer scale for the photolithography process is almost the extremity of optical discrimination. Further, the scaling down of the chip size and the design complexity of the integrated circuits also entail a multiplicity of problems, such as the crosstalk effect and the thermal issues on the chip.

In order to overcome the above-mentioned issues, a promising wafer-to-wafer stacking structure, which is also called as the three dimensional wafer structure, is provided. Please refer to FIG. 1(A), which schematically shows a conventional three dimensional wafer stacking structure according to the prior art. As shown in FIG. 1(A), a wafer stacking 100 includes a first wafer 10, a second wafer 20 and a third wafer 30, each of which consists of a substrate 12, 22, 32 and a device layer. Between the adjacent wafers, a bonding layer 13 is disposed there between for constructing the wafer stacking structure. As specifically illustrated in the FIG. 1(A), the respective device layers of the first and the second wafers 10, 20 are arranged to configure them as a face to face wafer stacking structure, while the respective device layers of the second and the third wafers 20, 30 are arranged to configure them as a back to front wafer stack. Furthermore, each wafers 10, 20, 30 further has plural circuit devices 16, 26, 36 in their respective device layer, which are electrically interconnected through the signal vias 15.

Please also refer to FIG. 1(B), which schematically shows a further three dimensional wafer stacking structure disclosed in U.S. Pat. No. 7,262,495. As shown in FIG. 1(B), the three dimensional wafer stacking 80 includes a plurality of interconnect plugs 8 for electrically interconnecting the two device layers 6, 24 of the two stacked wafers. Similar to the signal vias 15 of FIG. 1(A), the interconnect plugs 8 of FIG. 1(B) are also designed for the purpose of signal transmission between two stacked wafers.

Although it is clear that the vias 15 of the wafer stacking 100 in FIG. 1(A) or the interconnect plugs 8 of the wafer stacking 80 in FIG. 1(B) are disposed between two stacked wafers for electrically interconnecting the circuits formed in different wafers, it should be noted that these vias 15 or interconnect plugs 8 are not always extended between two solid surfaces in the device layer, such that they cannot provide sufficient rigidness for supporting the device layer. Accordingly, the low-k materials, which exist in the respective device layers and are used for allowing the conducting wires thereof being arranged closely, might be destroyed by compression stresses resulting from the stacking structure or by the thermal stresses resulting from the heat generated by the circuit devices.

In order to overcome such issues, the applicant of the present invention proposed a novel wafer-to-wafer stacking structure with at least one supporting pedestal formed between two solid surfaces in the device layer for enhancing the rigidness of the low-k material in the device layer. The relevant technical schemes are also proposed in the TW Patent Application No. 94137522 and its corresponding U.S. patent application Ser. No. 11/471,165. Nevertheless, although the above-mentioned supporting pedestal can be used for preventing the low-k materials existing in the device layer from being damaged by the stresses, it still exists the reliability issue for the low-k materials, since those low-k materials are usually made of the porous materials which are very sensitive to the humidity. Based on the above, it is necessary to find a new technical scheme to prevent the low-k materials existing in the device layer from being affected by the humidity for improving the reliability of the low-k materials used in the wafer stacking structure.

SUMMARY OF THE INVENTION

It is a first aspect of the present invention to provide a wafer-to-wafer stacking with a hermetic structure formed therein. The wafer stacking includes a first wafer, including a first substrate and a first device layer having thereon at least one chip and at least one low-k material layer, a second wafer disposed above the first wafer and having a second substrate, and a closed structure disposed on the at least one chip and arranged inside a cutting edge of the at least one chip, wherein the closed structure is extended from one side of the first device layer far from the first substrate to the other side thereof adjacent to the first substrate.

It is a second aspect of the present invention to provide a further wafer-to-wafer stacking with at least one hermetic structure formed therein. The wafer stacking includes a first wafer, including a first substrate and a device layer having thereon at least one chip and at least one low-k material layer, a second wafer disposed above the first wafer and having a second substrate, and a closed structure disposed on the at least one chip and arranged between a cutting edge and a bond pad of the at least one chip, wherein the closed structure is extended from one side of the device layer far from the first substrate to the other side thereof adjacent to the first substrate.

It is a third aspect of the present invention to provide a wafer-to wafer stacking with at least one hermetic structure. The wafer stacking includes a first wafer having thereon at least one chip, a second wafer disposed above the first wafer, and a closed structure disposed between the first and the second wafer and arranged inside a cutting edge of the at least one chip, wherein the closed structure is vertically extended from the first wafer to the second wafer.

The above objects and advantages of the present invention will become more readily apparent to those ordinarily skilled in the art after reviewing the following detailed descriptions and accompanying drawings, in which:

BRIEF DESCRIPTION OF THE DRAWINGS

FIG. 1(A) and FIG. 1(B) are diagrams schematically illustrating the conventional wafer-to-wafer stacking structures according to the prior arts;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 2:
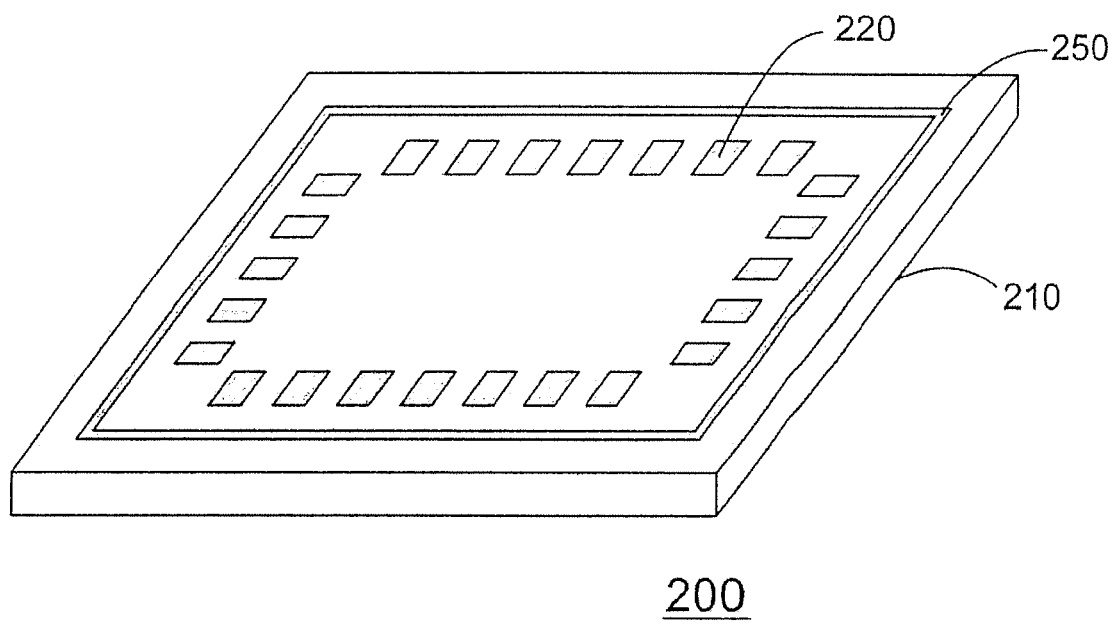
FIG. 2 is a diagram schematically illustrating a closed hermetic structure disposed on a chip cut from a wafer stacking according to the present invention.

In accordance with the present invention, a wafer-to-wafer stacking with a closed hermetic structure is provided. The closed hermetic structure is formed by a closed pedestal wall. Please refer to FIG. 2, which schematically shows a closed hermetic structure disposed on a chip cut from a wafer-to-wafer stacking according to the present invention. As shown in FIG. 2, a chip 200 cut from a wafer-to-wafer stacking usually includes a plurality of electronic components and connection wires (not shown). Further, a plurality of bond pads (as called the solder pads or I/O pads) 220 are disposed on the fringe of the chip 200 in order to transmit the signals into and/or out from the chip 200. In addition to the bond pads 220, a closed pedestal wall 250 is arranged inside the cutting edge 210 of the chip for forming a closed hermetic structure for preventing the low-k materials existing in the device layer of the chip from being affected by the incursive humidity. Preferably, the closed pedestal wall 250 is disposed between the bond pads 220 and the cutting edge 210 for further preventing the bond pads from being affected by the incursive humidity.

Figure 3:
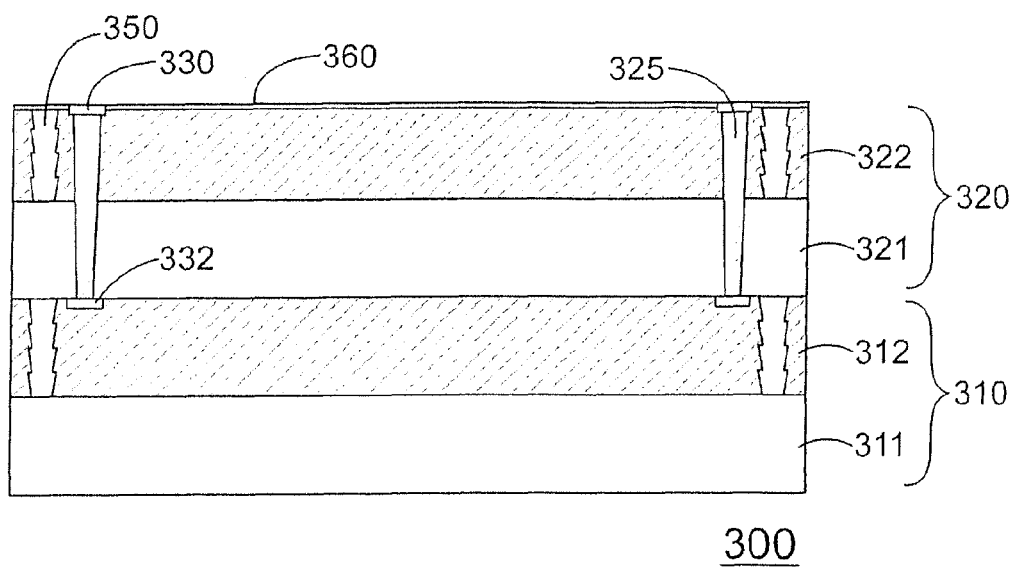
FIG. 3(A) is a cross section diagram schematically illustrating a wafer-to-wafer stacking with at least one closed hermetic structure according to a first embodiment of the present invention.
FIG. 3(B) is an alternative embodiment of FIG. 3(A)
Figure 3:
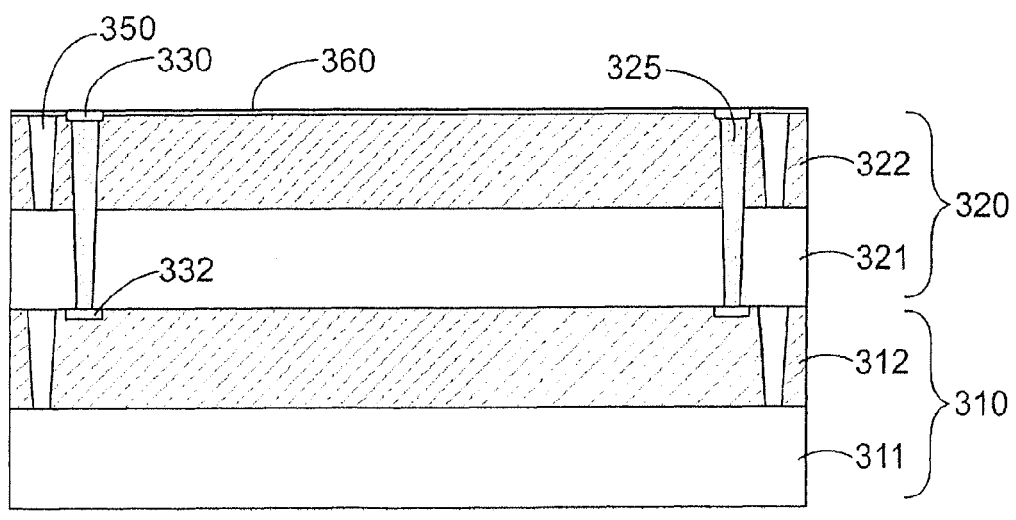

Please refer to FIG. 3(A), which schematically shows a cross section of a wafer-to-wafer stacking with at least one closed hermetic structure according to a first embodiment of the present invention. As shown in FIG. 3(A), the wafer-to-wafer stacking 300 according to a first embodiment of the present invention includes a first wafer 310 and a second wafer 320, both of which are arranged face-up, so as to configure the first and the second wafers 310, 320 as a back to face (or back to front) wafer stacking. Specifically, the first and the second wafers 310, 320 further include a first and a second substrates 311, 321 as well as a first and a second device layers 312, 322, respectively. Within each of the first and the second device layers 312, 322, at least one circuit device (not shown), which are generally designed as an integrated circuit chip, and at least one low-k layer (not shown) are formed therein. Typically, the integrated circuit chip could be one selected from a group consisting of an electro-static discharging (ESD) circuit, a passive element, a driving circuit and a power/ground shielding circuit, and the low-k layer could be made of the conventional low-k material, such as silicon oxide, or the porous materials. Furthermore, in order to electrically interconnect the circuit devices (or chips) arranged in the respective first with the second device layer 312, 322, at least one signal via 325 is formed between the first and the second wafers 310, 320 for electrically interconnecting the circuit devices 330, 332 arranged in the respective wafers 310, 320. Moreover, the wafer-to-wafer stacking 300 further includes a closed pedestal wall 350 arranged inside a cutting edge of the respective circuit devices or chips (as shown in FIG. 2). Specifically, the closed pedestal 350 wall is extended from one side of the device layer far from the substrate to the other side thereof adjacent to the substrate.

In a preferred embodiment of the present invention, the closed pedestals 350 disposed in the first and second device layer 312, 322 are formed a layer-by-layer etching process, where the etched space is filled with a supporting material forming the closed pedestal 350. Preferably, the etching process is one of a dry etching process and a chemical etching process. On the other hand, the closed pedestals 350 could also be formed by a laser drilling process, where the drilled space is filled with a supporting material forming the closed pedestal 350. Moreover, no matter what kind of process is used for the pedestal 350, the supporting material can be made of one selected from a group consisting of a metal material, an inorganic material and a nanometer material. In the further embodiment of the present invention, the pedestal 350 disposed between two stacked wafers could run through one of the first and second substrate or both substrates for dissipating heat generated within the first and second device layers. Nevertheless, it should be noted that the through hole in the substrate must be formed by a laser drilling process since the etching process does not work for the typical substrate material. Moreover, it should also be noted that an insulation layer or a passivation layer 360, as shown in FIG. 3(A), is formed on the top surface of the second device layer 322 of the second wafer 320 in order to facilitate the hermetic property of the second device layer 322.

Please refer to FIG. 3(B), which shows alternative embodiment of FIG. 3(A). As compared to the wafer-to-wafer stacking in FIG. 3(A), the constitutions and arrangements of the wafer-to-wafer stacking 300' in the FIG. 3(B) is almost similar to those of the wafer-to-wafer stacking 300 in FIG. 3(A). The only difference existing therebetween is that the closed pedestals 350 formed in the wafer-to-wafer stacking 300' are fabricated by a laser drilling process, where the drilled space is filled with a supporting material, such as an inorganic material or a nanometer material, for forming the closed pedestal 350.

Figure 4:
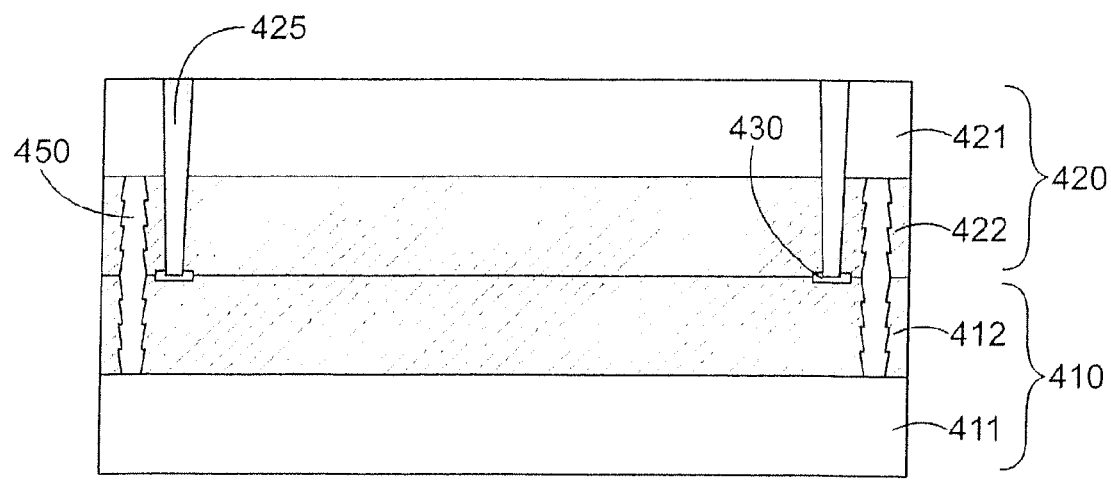
FIG. 4(A) is a cross section diagram schematically illustrating a wafer-to-wafer stacking with at least one closed hermetic structure according to a second embodiment of the present invention.
FIG. 4(B) is an alternative embodiment of FIG. 4(A)
Figure 4:
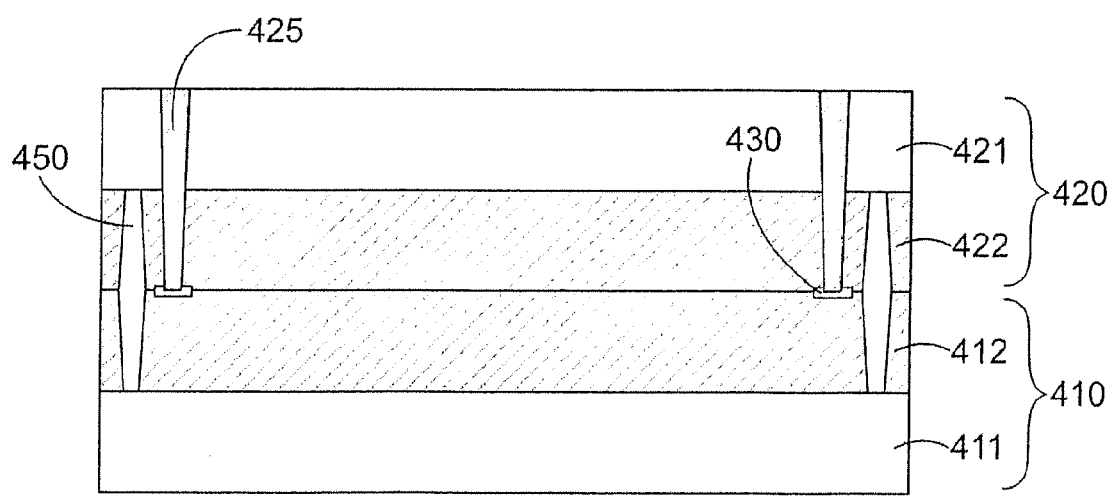

Please refer to FIG. 4(A), which schematically shows a cross section diagram of a wafer-to-wafer stacking with at least one closed hermetic structure according to a second embodiment of the present invention. In comparison with the wafer-to-wafer stacking 300 in FIG. 3(A), the wafer-to-wafer stacking 400 in FIG. 4(A) also includes a first wafer 410 and a second wafer 420, which respectively have a first and a second substrates 411, 421 as well as a first and a second device layers 412, 422. The only difference existing between the wafer stacking 300 and the wafer stacking 400 is that the second device layer 422 of the second wafer 420 in the wafer stacking 400 is configured as a face-down arrangement, i.e. the second device layer 422 thereof is faced down and adjacent to the first device layer 412, so as to configure the first and the second wafers 410 and 420 as a face to face wafer stacking. Since the second device layer 422 of the second wafer 420 is adjacent to the first device layer 412 of the first device wafer 410, not only the thickness of the first and the second device layers 412 and 422 but also the interconnection distance of the signal vias 425 extending between the circuit devices (or chips) 430 in the respective device layers 412 and 422 can be remarkably reduced. Therefore, the thickness of the face to face wafer stacking 400 could have a promising compactness over the other wafer stacking structure. Furthermore, as mentioned above, the closed pedestal 450 formed in the respective device layers could be fabricated by one of an etching process and a drilling process. In a preferred embodiment of the face to face wafer stacking, the closed pedestal in the second device layer 422 could be vertically aligned with the closed pedestal formed in the first device layer 412 for enhancing the supporting strength of the wafer stacking. Similarly, the wafer-to-wafer stacking 400' in FIG. 4(B) is an alternative embodiment of FIG. 4(A). The only difference existing between the wafer stacking 400 and wafer stacking 400' is that the closed pedestals formed in the wafer-to-wafer stacking 400' are fabricated by a laser drilling process, where the drilled space is filled with a supporting material, such as an inorganic material or a nanometer material, for forming the closed pedestal 450. Moreover, as mentioned in the first embodiment, the pedestal 450 of the second embodiment, which is disposed between two stacked wafers, could run through one of the first and second substrate or both substrates for dissipating heat generated within the first and second device layers.

Figure 5:
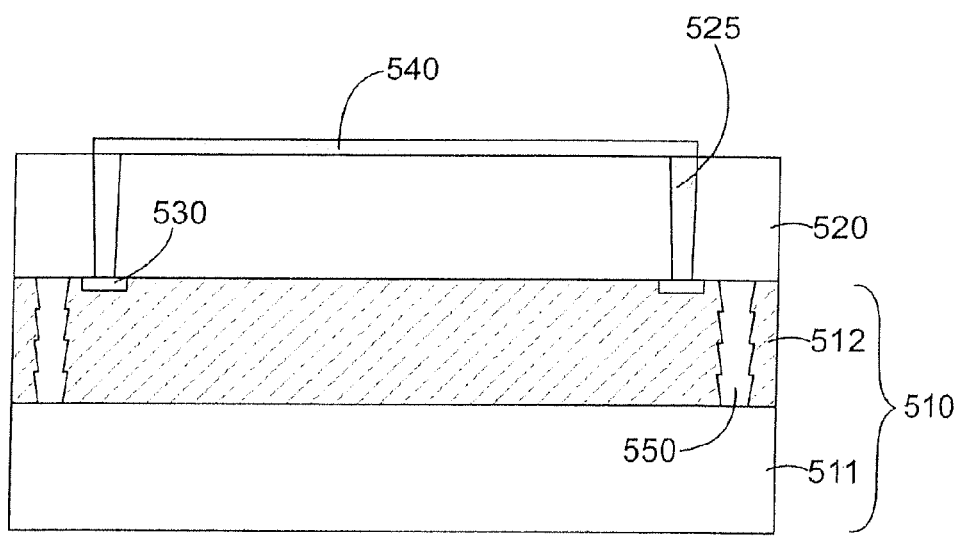
FIG. 5(A) is a cross section diagram schematically illustrating a wafer-to-wafer stacking with at least one closed hermetic structure according to a third embodiment of the present invention.
FIG. 5(B) is an alternative embodiment of FIG. 5(A).
Figure 5:
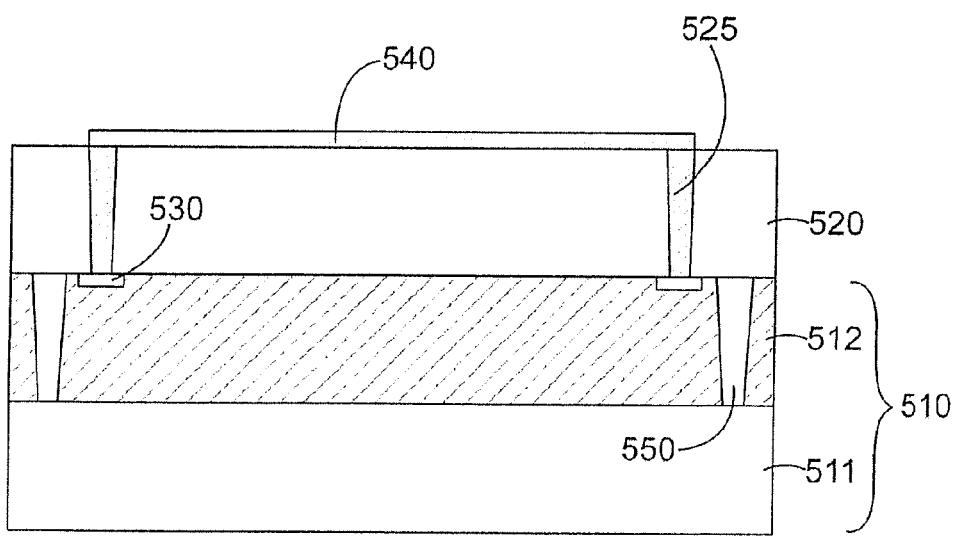

Please refer to FIG. 5(A), which schematically shows a cross section diagram of a wafer-to-wafer stacking with at least one closed hermetic structure according to a third embodiment of the present invention. In comparison with the wafer-to-wafer stacking 300 in FIG. 3(A), the wafer-to-wafer stacking 500 in FIG. 5(A) similarly includes a first wafer 510 and a second wafer 520, and the first wafer 510 also includes a substrates 511 and a device layer 512. The only difference existing between the wafer stacking 300 and 500 is that there exist no device layer on the second wafer 520. Accordingly, the second wafer 520 in the wafer-to-wafer stacking 500 is regarded as a dummy wafer, which is only for the protection or wiring purpose. As a dummy wafer for the wiring purpose, there could be a wiring layer 520 formed on the substrate of second wafer 520 for electrically connecting with the vias 525 passing from the circuit devices (or chip) 530 disposed between the stacked wafers. Although there is no device layer formed on the second wafer 520, there still exists the closed pedestal 550 formed in the device layer of the first wafer. Similarly, the closed pedestal 550 is disposed between the first and the second wafers 510 and 520 and arranged inside a cutting edge of the chip (as shown in FIG. 2). Furthermore, the closed pedestal 550 is also vertically extended from the top surface of 512 to the bottom surface of 512. Moreover, as mentioned above, the closed pedestal 550 could be fabricated by one of an etching process and a drilling process. Similarly, the wafer-to-wafer stacking 500' in FIG. 5(B) is an alternative embodiment of FIG. 5(A). The only difference existing between the wafer stacking 500 and wafer stacking 500' is that the closed pedestals 550 formed in the wafer-to-wafer stacking 500' are fabricated by a laser drilling process, where the drilled space is filled with a supporting material, such as an inorganic material or a nanometer material, for forming the closed pedestal 550.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A wafer-to-wafer stacking, comprising:
    a first wafer, including a first substrate and a first device layer having thereon at least one chip and at least one low-k material layer;
    a second wafer disposed above the first wafer and having a second substrate; and
    a closed structure disposed on the at least one chip and arranged inside a cutting edge and fully around all of at least one circuit device of the at least one chip, wherein the closed structure is extended from one side of the first device layer far from the first substrate to the other side thereof adjacent to the first substrate.

2. A wafer-to-wafer stacking according to claim 1, wherein the first device layer is adjacent to the second substrate, so as to configure the first and the second wafers as a back to front wafer stacking.

3. A wafer-to-wafer stacking according to claim 1, wherein the second wafer has a second device layer adjacent to the first device layer, so as to configure the first and the second wafers as a face to face wafer stacking.

4. A wafer-to-wafer stacking according to claim 3, wherein the second device layer has a further closed structure vertically aligned with the closed structure formed in the first device layer.

5. A wafer-to-wafer stacking according to claim 3, wherein the closed structures run through one of the first and second substrates for dissipating heat generated within the first and second device layers.

6. A wafer-to-wafer stacking according to claim 1, wherein the closed structure is formed by an etching process, where the etched space is filled with a supporting material forming the closed structure.

7. A wafer-to-wafer stacking according to claim 6, wherein the etching process is one of a dry etching process and a chemical etching process.

8. A wafer-to-wafer stacking according to claim 1, wherein the closed structure is formed by a drilling process, where the drilled space is filled with a supporting material forming the closed structure.

9. A wafer-to-wafer stacking according to claim 1, wherein the closed structure is made of one selected from a group consisting of a metal material, an inorganic material and a nanometer material.

10. A wafer-to-wafer stacking, comprising:
    a first wafer, including a first substrate and a device layer having thereon at least one chip and at least one low-k material layer;
    a second wafer disposed above the first wafer and having a second substrate; and
    a closed structure disposed on the at least one chip and arranged inside a cutting edge and fully around all of at least one bond pad of the at least one chip, wherein the closed structure is extended from one side of the device layer far from the first substrate to the other side thereof adjacent to the first substrate.

11. A wafer-to-wafer stacking according to claim 10, wherein the second wafer has a circuit layer adjacent to the device layer, so as to configure the first and the second wafers as a face to face wafer stacking.

12. A wafer-to-wafer stacking according to claim 11, wherein the circuit layer has a further closed structure vertically aligned with the closed structure formed in the device layer.

13. A wafer-to-wafer stacking according to claim 11, wherein the circuit layer comprises one selected from a group consisting of an electro-static discharging (ESD) circuit, a passive element, a driving circuit and a power/ground shielding circuit.

14. A wafer-to-wafer stacking according to claim 10, wherein the second wafer is a dummy wafer.

15. A wafer-to-wafer stacking according to claim 14, wherein the second wafer further comprises a wiring layer electrically connected to the device layer through a signal via.

16. A wafer-to-wafer stacking according to claim 10, wherein the closed structures run through one of the first and second substrates for dissipating heat generated within the device layers.

17. A wafer-to-wafer stacking according to claim 10, wherein the closed structure is formed by one of an etching process and a drilling process, where the etched or drilled space is filled with a supporting material forming the closed structure.

18. A wafer-to-wafer stacking according to claim 10, wherein the closed structure is made of one selected from a group consisting of a metal material, an inorganic material and a nanometer material.

19. A wafer-to-wafer stacking, comprising:
a first wafer having thereon at least one chip;
a second wafer disposed above the first wafer; and
a closed structure disposed between the first and the second wafer and arranged inside a cutting edge of the at least one chip, wherein the closed structure is vertically extended from the first wafer to the second wafer and horizontally extended to form an enclosing wall.

* * * * *